(12) United States Patent
Furuyama

(10) Patent No.: US 6,879,521 B2
(45) Date of Patent: Apr. 12, 2005

(54) THRESHOLD VOLTAGE ADJUSTMENT METHOD OF NON-VOLATILE SEMICONDUCTOR MEMORY DEVICE AND NON-VOLATILE SEMICONDUCTOR MEMORY DEVICE

(75) Inventor: Takaaki Furuyama, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 259 days.

(21) Appl. No.: 10/369,496

(22) Filed: Feb. 21, 2003

(65) Prior Publication Data
US 2004/0008567 A1 Jan. 15, 2004

(30) Foreign Application Priority Data
Jul. 12, 2002 (JP) ...................... 2002-204686

(51) Int. Cl.⁷ ............................................. G11C 16/04
(52) U.S. Cl. ............................. 365/185.24; 365/185.18; 365/185.2
(58) Field of Search ..................... 365/185.24, 185.18, 365/185.2

(56) References Cited
U.S. PATENT DOCUMENTS
5,566,111 A * 10/1996 Choi ..................... 365/185.24
5,751,632 A * 5/1998 Choi et al. ............... 365/185.2

FOREIGN PATENT DOCUMENTS
JP 08-055487 2/1996
JP 2001-291393 10/2001

* cited by examiner

Primary Examiner—Huan Hoang
(74) Attorney, Agent, or Firm—Arent Fox PLLC

(57) ABSTRACT

It is intended to provide a nonvolatile semiconductor memory device which maintains the maximum number of over-erase memory cells which are conductive when adjusting the threshold voltage after data erase by controlling the gate voltage of a memory cell continuously in order to adjust the threshold voltage in a short time and a nonvolatile voltage adjustment method. There is formed a feedback loop for controlling the number of memory cells to be conductive in a memory cell group by controlling a gate voltage generating circuit through a differential amplifier from a drain terminal and the gate voltage generating circuit is controlled by the differential amplifier so as to maintain the drain voltage at a predetermined drain voltage VRF. A variable gate voltage can be controlled continuously by a feedback loop for controlling the variable gate voltage based on a difference voltage between the drain voltage and the predetermined drain voltage. Thus, effective threshold voltage adjustment operation is enabled corresponding to a current supply capacity regardless of the current supply capacity of the drain voltage generating circuit.

20 Claims, 10 Drawing Sheets

CIRCUIT DIAGRAM OF FIRST EMBODIMENT

PRINCIPLE DIAGRAM OF PRESENT INVENTION

CIRCUIT DIAGRAM OF FIRST EMBODIMENT

SPECIFIC EXAMPLE OF WORD LINE DRIVER

SPECIFIC EXAMPLE OF Y PATH GATE

OPERATIONAL WAVEFORM OF FIRST EMBODIMENT

FIRST VARIANT OF WORD LINE VOLTAGE GENERATING CIRCUIT

SECOND VARIANT OF WORD LINE GENERATING CIRCUIT

FIRST VARIANT OF WORD LINE BIAS VOLTAGE DETECTING SECTION

SECOND VARIANT OF WORD LINE BIAS VOLTAGE DETECTING SECTION

CIRCUIT DIAGRAM OF SECOND EMBODIMENT

SECTIONAL VIEW OF MEMORY CELL BIASED TO ERASE OPERATION STATE

THRESHOLD VOLTAGE DISTRIBUTION OF MEMORY CELL IN ERASE OPERATION AND APDE OPERATION

CIRCUIT BLOCK DIAGRAM SHOWING BIAS RELATION IN CONVENTIONAL APDE OPERATION

WAVEFORM OF GATE VOLTAGE IN OTHER CONVENTIONAL APDE OPERATION

THRESHOLD VOLTAGE ADJUSTMENT METHOD OF NON-VOLATILE SEMICONDUCTOR MEMORY DEVICE AND NON-VOLATILE SEMICONDUCTOR MEMORY DEVICE

CROSS-REFERENCE TO RELATED APPLICATIONS

This application is based upon and claims the benefit of priority from each of the prior Japanese Patent Application No. 2002-204686 filed on Jul. 12, 2002, the entire contents of which are incorporated herein by reference.

BACKGROUND OF THE INVENTION

1. Field of the Invention

The present invention relates to a threshold voltage adjustment method of a non-volatile semiconductor memory device, which allows memory data to be electrically rewritten and a non-volatile semiconductor memory device. Particularly, the present invention relates to adjustment of the threshold voltage of the memory cell after data is erased.

2. Description of Related Art

As shown in FIG. 11, in an N-type memory cell of a non-volatile semiconductor memory device represented by a flash memory, a floating gate FG is formed through an insulation film over a channel region between a source region S and a drain region D and further, a control gate CG is formed through an insulation film on the floating gate FG. Data is memorized by a difference in threshold voltage of the memory cell, which depends on whether or not an electrons e are accumulated on the floating gate FG. A state in which the threshold voltage is kept low because the electrons e are discharged from the floating gate FG is regarded as a memory state of data "1" and a state in which the threshold voltage is kept high because the electrons e are accumulated is regarded as a memory state of data "0".

Write of data into the memory cell is carried out by injecting electrons e into the floating gate FG of the memory cell, which is a write-in object, with a state in which electrons e are discharged from the floating gates FG of all the memory cells (memory state of data "1") as an initial state. The write-in operation refers to writing "0" data into the memory cell and this operation is called program operation.

To make all the memory cells into the initial state, prior to the program operation, erase operation, which is discharging electrons e from the floating gate so as to produce the memory state of data "1", is necessary. This erase operation is carried out by discharging electrons e using FN tunneling phenomenon. This is done under a condition in which with the control gate CG as a negative voltage (=−V), a back gate which constitutes the channel region is brought into a positive voltage (=+V) (case for channel erase). Although not shown here, there is also a method of making the source region S into a positive voltage (=+V) (case of source erase). In case of a flash memory in which the erase operation is executed in each unit of a sector or the like in batch, the state of all the memory cells in the sector needs to be in the "0" data memory state prior to discharging electrons e or the floating gate FG needs to keep electrons e. Consequently, electrons e can be discharged in batch from the floating gates FG of all the memory cells. FIG. 12(A) shows a distribution of the threshold voltage of the memory cell in data erase operation. If the erase operation is executed, distribution of high threshold voltage, which is "1" data memory state, is changed to distribution of low threshold voltage.

After the erase operation, the memory data turns into "1", data memory state. In this case, the maximum value of the threshold voltage is desired to be set low from viewpoints of margin of data readout. After the erase operation is executed in batch, distribution of the threshold voltage comes to have a predetermined expansion because of characteristic variation due to manufacturing reason and characteristic variation of individual memory cells originating from asymmetry in chip layout, application voltage or the like. Thus, as shown in a region (I) of FIG. 12(A), there may exist a memory cell indicating depletion characteristic in which the threshold voltage lowers below 0V. This is so-called over-erase state. Such a memory cell in the over-erase state is subjected to threshold voltage adjustment of raising the threshold voltage by injecting hot electrons e into the floating gate FG by applying a voltage bias similar to the program operation (FIG. 12(B)). This is so-called auto program disturb after erase (APDE) operation. As for voltage stress upon the APDE operation, with a positive voltage applied to a drain region D with respect to a source region S, a gate voltage, which will be described later, is applied to a control gate CG. An over-erase memory cell having a threshold voltage lower than the gate voltage is conductive so as to inject electrons e into the floating gate FG so that the threshold voltage is raised.

FIG. 13 shows a basic circuit block diagram upon the APDE operation. Each drain terminal of a memory cell group 100 is connected to a common bit line BL and the bit line BL is connected to a drain voltage generating circuit 400. Upon the APDE operation, the drain voltage generating circuit 400 applies a positive voltage VPP to the bit line BL and supplies it to the drain terminal of the memory cell group 100. Each gate terminal is connected in common and maintained to have a voltage difference of 0V with respect to the source terminal (VG=VS=0V). The drain voltage VD becomes a positive voltage VPP (VD=VPP) in a range of voltage supply capacity of the drain voltage generating circuit 400. Therefore, if there exist many memory cells having depletion characteristic (region (I) of FIG. 12(A)), a large amount of current is required for adjustment of the threshold voltage and the positive voltage applied to the drain terminal may lower depending on the capacity of the drain voltage generating circuit 400 so that the adjustment efficiency also drops, thereby taking much time for the APDE operation. Here, it can be considered to use a boosted voltage with respect to the power source voltage VCC as the positive voltage VPP. In this case, a charge pump circuit or the like can be considered as the drain voltage generating circuit 400.

As a conventional technology considering shortage of the APDE operation time, Japanese Laid-Open Patent Publication No.8-55487 has disclosed a method in which correction of the threshold voltage of an over-erase memory cell is started with a gate voltage VG of a negative voltage (for example, VG=−1.0V) instead of the gate voltage VG in FIG. 13 and the gate voltage VG is increased by step until the memory cell reaches a desired minimum threshold voltage. For example, as shown in FIG. 14, with the source voltage VS of 0V and drain voltage VD of 6.0 V, the gate voltage VG of −1.0V, −0.75V, −0.5V, −0.25V is applied by step. Consequently even an over-erase memory cell is not conductive if its threshold voltage is higher than the gate voltage VG of a negative voltage so that current necessary for adjustment operation is reduced. As a result, the circuit size of the drain voltage generating circuit 400 which outputs the positive voltage VPP can be reduced.

However, under a bias condition in which the gate voltage VG is 0V of FIG. 13, all the over-erase memory cells having the depletion characteristic that the threshold voltage is a negative voltage come to be conductive. For the reason, under a condition having a large distribution (region (I) in FIG. 12(A)) of over-erase memory cells each whose threshold voltage turns to a negative voltage upon the erase operation, all the memory cells belonging to the region (I) come to be conductive in the APDE operation so that a large drain current flows. If this drain current increases over the supply capacity of the drain voltage generating circuit 400, the drain voltage VD lowers from the positive voltage VPP. As a result, voltage stress to the drain terminal lowers so that the quantity of hot electrons is reduced thereby worsening injecting efficiency of electrons into the floating gate FG. Consequently, the APDE operation time is prolonged and depending on case, adjustment itself of the threshold voltage may be disabled.

According to a method of increasing the gate voltage VG by step by starting from a negative voltage as indicated in FIG. 14, an applied voltage and applied time for each step are predetermined. On the other hand, the operation characteristic of the memory cell has a predetermined expansion because of characteristic variation due to difference in usage condition such as environmental temperature and operation voltage as well as characteristic variation of each memory cell originating from manufacturing. Thus, when the gate voltage VG is set up for the APDE operation, a sufficient allowance needs to be secured so that the sum of the drain current does not reach a limit of the current supply capacity of the drain voltage generating circuit 400. In each step, the number of the over-erase memory cells to be conductive is limited and the gate voltage VG is set up so that the sum of the drain current is settled within the current supply capacity of the drain voltage generating circuit 400. For the reason, the APDE operation cannot be carried out at the maximum capacity of the drain voltage generating circuit 400 so that it may take a large amount of time for the APDE operation.

SUMMARY OF THE INVENTION

The present invention is made to resolve above-described problems. It is an object of the present invention to provide a threshold voltage adjustment method of a non-volatile semiconductor memory device capable of adjusting threshold voltage in a short time and a non-volatile semiconductor memory device capable of the same, wherein the non-volatile semiconductor memory device can electrically rewrite memory data, and even though large number of over-erase memory cells exit due to erase operation, gate voltage of memory cells is continuously controlled so that the number of conductive over-erase memory cells is kept at maximum for threshold voltage adjustment after data erase.

To achieve the object, according to one aspect of the present invention, there is provided a threshold voltage adjustment method of a non-volatile semiconductor memory device that has memory cells and conducts data erase of the memory cells by changing threshold voltage with electrical bias, the threshold voltage adjustment method adjusting the threshold voltage to the memory cells after the data erase and comprising steps of: drain voltage applying step for applying drain voltage to drain terminals of the memory cells; comparing step for comparing the drain voltage to be applied to the drain terminals with predetermined drain voltage; and gate voltage applying step for controlling the drain voltage applying step by applying variable gate voltage to gate terminals of the memory cells in accordance with a comparison result obtained in the comparing step.

In the threshold voltage adjustment method of a non-volatile semiconductor memory device according to one aspect of the present invention, drain voltage to be applied to the drain terminals of memory cells in the drain voltage applying step is compared with the predetermined drain voltage in the comparing step. Variable gate voltage in accordance with a comparison result is applied to gate terminals through the gate voltage applying step, whereby the drain voltage applying step is controlled.

Furthermore, according to another aspect of the present invention, there is provided a non-volatile semiconductor memory device conducting data erase of memory cells by changing threshold voltage with electrical bias, for adjusting the threshold voltage of the memory cells after the data erase, the non-volatile semiconductor memory device comprising: a drain voltage generating section for supplying drain voltage to drain terminals of the memory cells, the drain voltage generating section being activated based on a threshold voltage adjusting signal; a drain voltage detecting section for detecting the drain voltage; and a gate voltage generating section for controlling variable gate voltage to be applied to gate terminals of the memory cells based on a drain voltage detecting signal from the drain voltage detecting section, the gate voltage generating section being activated based on the threshold voltage detecting signal.

In the non-volatile semiconductor memory device according to one aspect of the present invention, the drain voltage generating section and the gate voltage generating section are activated based on a threshold voltage adjusting signal for adjusting threshold voltage of memory cells after data erase. Drain voltage outputted from the drain voltage generating section and applied to the drain terminals of the memory cells is detected by the drain voltage detecting section. Variable gate voltage is controlled in accordance with a drain voltage detecting signal from the drain voltage detecting section.

Thereby, in case threshold voltage of memory cells relating to over-erase that distributes in a depletion region threshold voltage of which is same or lower than 0V after data erase is conducted, variable gate voltage based on drain voltage detecting signal outputted from the drain voltage detecting section is applied to the gate terminals so as to control drain voltage.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Figure 1:
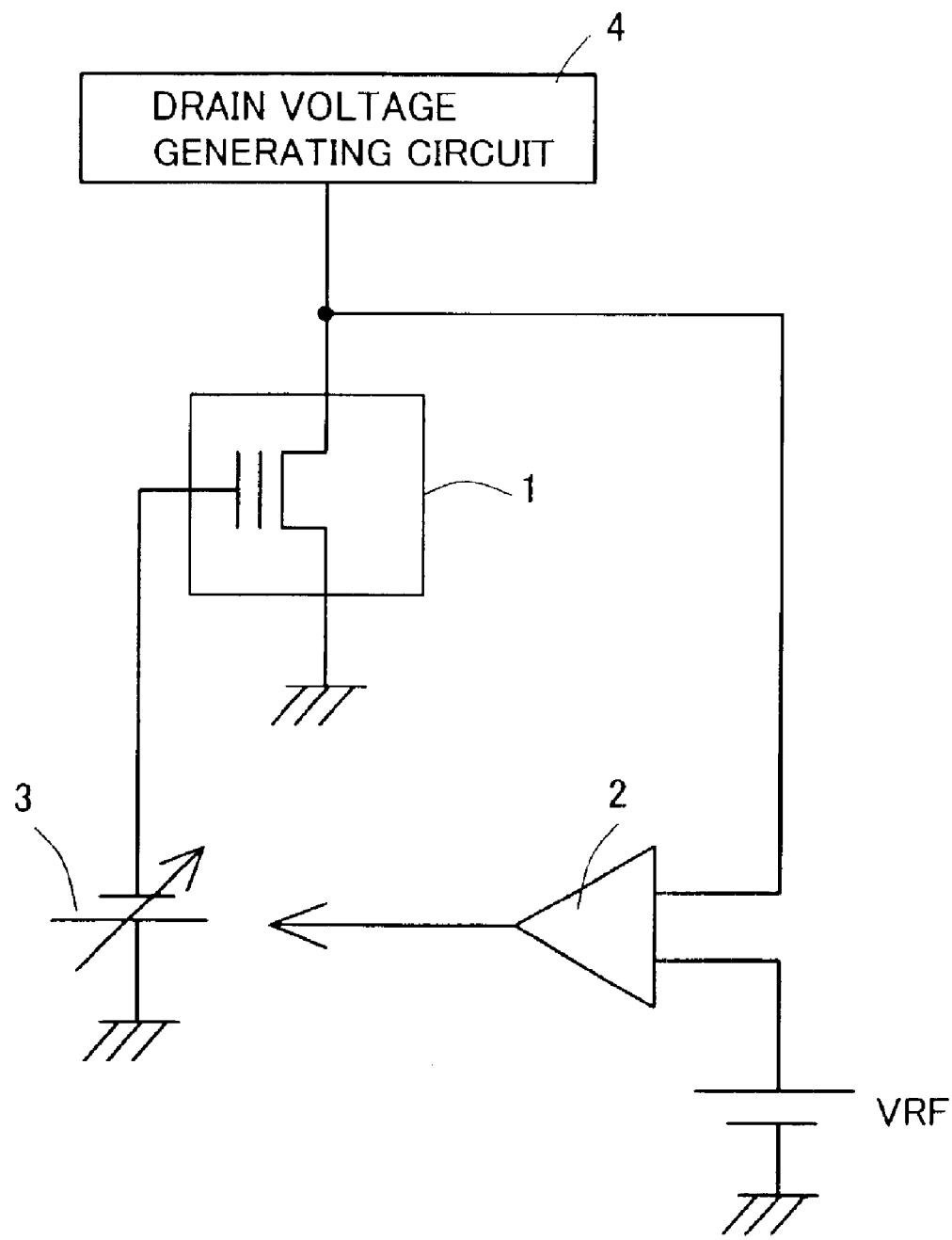
FIG. 1 is a principle diagram of the present invention.

FIG. 1 shows a principle diagram of the present invention. A drain terminal of a memory cell group 1 containing plural memory cells is connected to a drain voltage generating circuit 4. A drain voltage to be applied to the drain terminal is inputted to a differential amplifier 2 and an output signal subjected to differential amplification by a predetermined drain voltage VRF is inputted to a gate voltage generating circuit 3. A variable gate voltage is inputted to a gate terminal of the memory cell group 1 from the gate voltage generating circuit 3 with a negative voltage as an initial voltage. A feedback loop is constructed by controlling the gate voltage generating circuit 3 through the differential amplifier 2 from the drain terminal so as to control the number of memory cells becoming conductive in the memory cell group 1.

The gate voltage generating circuit 3 is controlled by the differential amplifier 2 so as to maintain the drain voltage at a predetermined drain voltage VRF. That is, if the respective memory cells in the memory cell group 1 are conductive exceeding current supply capacity of the drain voltage generating circuit 4 and the drain voltage generating circuit 4 becomes over-loaded, the drain voltage lowers. The feedback loop containing the differential amplifier 2 serves for drain voltage after that lowers. As a result, the variable gate voltage lowers, whereby the number of memory cells becoming conductive is reduced. Consequently, current inputted to the drain terminal of the memory cell group 1 is reduced so that the drain voltage generating circuit 4 escapes from its overload condition. Consequently, the drain voltage is restored and maintained at a predetermined drain voltage.

Conversely, if the number of the memory cells becoming conductive within the memory cell group 1 is small and current supply from the drain voltage generating circuit 4 is also small, the drain voltage rises. The feedback loop containing the differential amplifier 2 is applied to so that the variable gate voltage also rises. Thereby, the number of memory cells becoming conductive is increased. Consequently, current inputted to the drain terminal of the memory cell group 1 is increased so that current supply from the drain voltage generating circuit 4 is also increased and then, the drain voltage is maintained at a predetermined drain voltage.

The variable gate voltage can be controlled continuously by the feedback loop for controlling the variable gate voltage based on a difference voltage between the drain voltage and the predetermined drain voltage. As a result, an effective adjustment of the threshold voltage can be carried out irrespective of current supply capacity of the drain voltage generating circuit 4.

Hereinafter, the embodiment of the threshold voltage adjustment method of non-volatile semiconductor memory device and the non-volatile semiconductor memory device of the present invention will be described in detail with reference to FIGS. 2–10.

Figure 2:
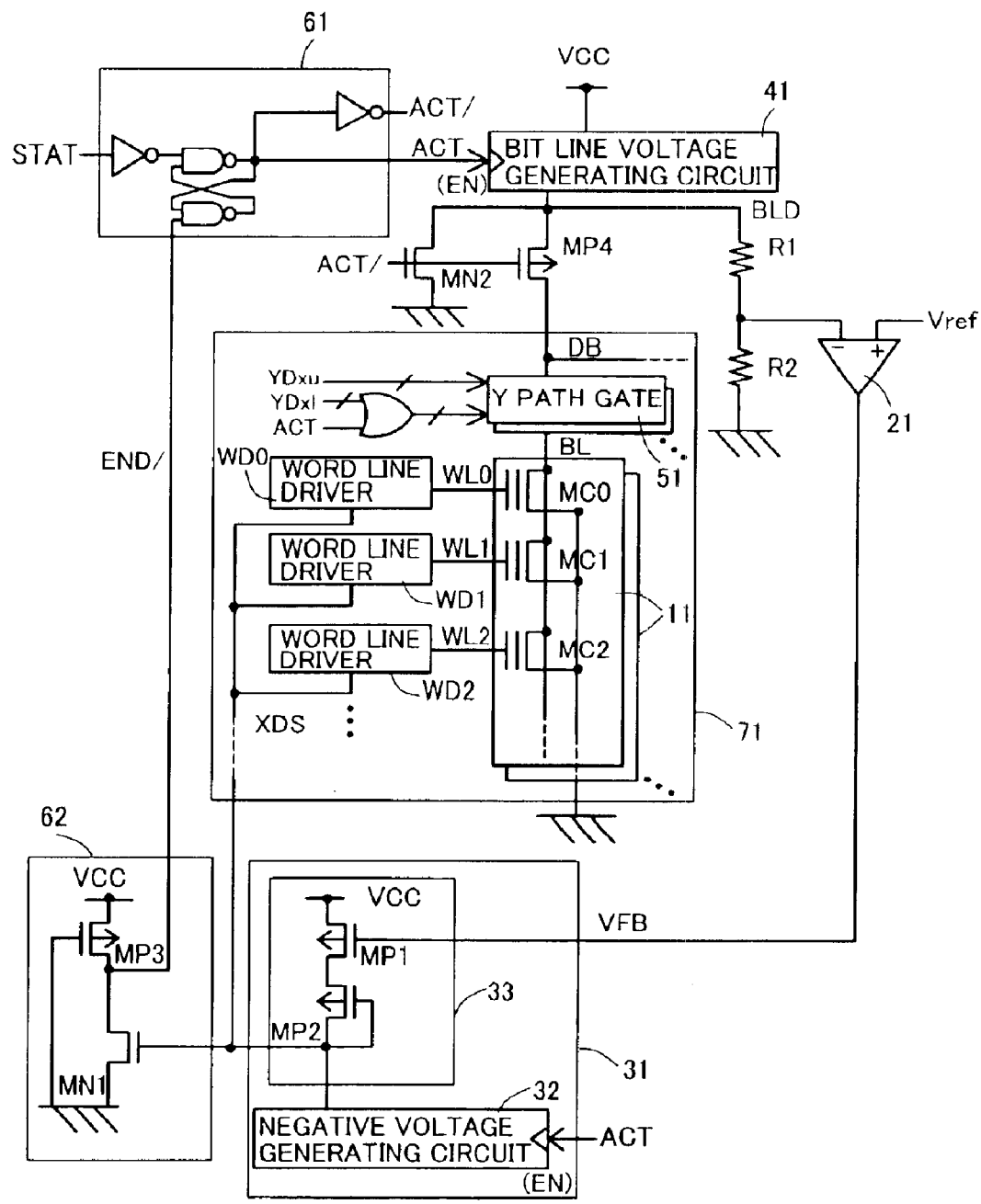
FIG. 2 is a circuit diagram of a first embodiment.

FIG. 2 shows a circuit diagram of a first embodiment of the present invention. A positive logic APDE-start signal STAT is inputted from a control circuit (not shown) into a state latch circuit 61. Further, a negative logic APDE-end signal END/ is inputted into the state latch circuit 61 so that a state of whether or not the APDE is activated is latched by a flip-flop circuit constituted by NAND gate. A positive logic state signal ACT and a negative logic state signal ACT/ indicating that the APDE is activated are outputted from the state latch circuit 61. Here the positive logic refers to a signal indicating propagated information as high level and the negative logic refers to a signal indicating the propagated information as low level.

The state signal ACT is inputted to an enable terminal EN of a bit line voltage generating circuit 41 and a bit line bias voltage BLD is outputted depending on activation of the state signal ACT. The bit line bias voltage BLD refers to a voltage applied to the drain terminals of the memory cells MC0–MC2, which will be described later, when the APDE is activated and may be sometimes raised from the power source voltage VCC in order to carry out an effective APDE operation. In this case, a charge pump circuit may be used for the bit line voltage generating circuit 41. In the charge pump circuit, the capacity of current which can be supplied is predetermined from a capacitor element in order to accumulate and boosted voltage by pumping and an operation frequency for determining pumping operation and the memory cells MC0–MC2 need to be biased within the range of this driving performance.

An output terminal of the bit line bias voltage BLD is connected to a data line DB which is a data input/output line from a sector 71 in the memory cell array through a PMOS transistor MP4, which is controlled by the state signal ACT/ and connected to ground voltage by an NMOS transistor MN2, which is supplied and controlled by the state signal ACT/. In the APDE operation condition, at the same time when the state signal ACT becomes high level so that the bit line voltage generating circuit 41 is activated, the state signal ACT/ becomes low level and the NMOS transistor MN2 becomes non-conductive. At the same time, the PMOS transistor MP4 is conductive so as to supply the bit line bias voltage BLD to the data line DB of the sector 71. If the APDE operation condition is terminated, the logical level of the state signal ACT and ACT/ is inverted so that the bit line voltage generating circuit 41 is separated from the data line DB and an output terminal of the bit line bias voltage BLD is maintained at ground voltage.

The bit line bias voltage BLD is divided by divided resistances R1, R2 and inputted to a non-inversion input terminal of a differential amplifier 21. A reference voltage Vref is inputted to the non-inversion input terminal and a difference voltage between the input terminals is amplified so that a differential amplification signal VFB is outputted. Although according to the first embodiment, the inversion input terminal of the differential amplifier 21 is provided with divided resistances R1, R2 and the bit line bias voltage BLD is divided upon supply, it is permissible to input the bit line bias voltage BLD just as it is or shift to a predetermined voltage level upon the input.

The data line DB is connected to a Y path gate 51 in the sector 71. The Y path gate 51 is selected by column address YDxu of high-order-bit and column address YDxl of low-order-bit ORed with the state signal ACT. Upon usual data access, a bit line 11 of plural bit lines is connected to and upon the APDE operation, at least a bit line 11 of plural bit lines is connected to the data line DB. Because, upon ordinary data access, data input/output operation is carried out through the data line DB, a single bit line 11 is selected. Upon the APDE operation, a voltage can be supplied to a predetermined number of the bit lines 11 within the range of a supply performance of the bit line bias voltage BLD outputted from the bit line voltage generating circuit 41. If, of the memory cells MC0–MC2 connected to a bit line, the number of over-erase cells is large, a small number of the bit lines 11 can be connected at the same time and if the number of the over-erase memory cells is small, a large number of the bit lines 11 can be connected at the same time.

The data line DB may be provided in an opposite direction to the bit line voltage generating circuit 41 instead of providing it between the Y path gate 51 and the bit line voltage generating circuit 41. In this case, a new path gate only should be provided in order to connect the data line DB to the plural bit lines 11 upon the ordinary data access. Consequently, a necessity of supplying bit line bias voltage BLD outputted from the bit line voltage generating circuit 41 to the data bus DB is eliminated, thereby reducing a load which the bit line voltage generating circuit 41 should drive.

The drain terminals of the plural memory cells MC0–MC2 whose source terminals are connected to ground voltage are connected to each bit line 11. Word line drivers WD0–WD2 and word lines WL0–WL2 are connected to the gate terminals of the memory cells MC0–MC2 of each bit line 11. The respective word line drivers WD0–WD2 are selected by a row address (not shown) upon ordinary data access so that any one memory cell of the memory cells MC0–MC2 is biased. A selected word line is connected so as to carry out input/output of data into the memory cell of each bit line 11. Upon the APDE operation, all the word lines WL0–WL2 make the word line drivers WD0–WD2 inactive so that low level is biased. An object of the APDE operation is to adjust the threshold voltage of the over-erase memory cell which drops below 0V to an adjustment voltage of more than 0V. Thus, the memory cell having a normal threshold voltage over the adjustment voltage needs to be so biased that threshold voltage is not adjusted. For the reason, the above described low-level voltage value needs to be a word line bias voltage set up appropriately.

Upon the APDE operation, the word line bias voltage is supplied from the word line drivers WD0–WD2 to each word line WL0–WL2 through a variable reference voltage terminal XDS generated by the word line voltage generating circuit 31. The state signal ACT is inputted to the enable terminal of a negative voltage generating circuit 32 within the word line voltage generating circuit 31 so that the state signal ACT is activated at high level. An output terminal of the negative voltage generating circuit 32 is connected to the variable reference voltage terminal XDS and also connected to an output terminal of a voltage adjusting section 33.

The voltage adjusting section 33 comprises a PMOS transistor MP1 whose source terminal is connected to a power source voltage VCC and whose gate terminal is controlled by a differential amplification signal VFB, and a PMOS transistor MP2 whose source terminal is connected to a drain terminal of the PMOS transistor MP1 and whose gate terminal and drain terminals are connected to each other so as to work out as diode connection. The drain terminal of the PMOS transistor MP2 serves for an output terminal.

The PMOS transistor MP1 functions as a voltage control current source or a voltage control resistance and if its ON resistance is changed depending on the voltage of the differential amplification signal VFB, is conductive. A positive voltage which has dropped from the power source voltage VCC is lowered by the ON resistance and by the PMOS transistor MP2 diode connected adjusts a negative voltage outputted from the negative voltage generating circuit 32. The word line bias voltage supplied to the variable reference voltage terminal XDS is adjusted for output with respect to the negative voltage outputted from the negative voltage generating circuit 32 by current control with the differential amplification signal VFB at the gate terminal of the PMOS transistor MP1 and a voltage lowering from the power source voltage VCC by the ON resistance of the PMOS transistor MP1 which is current-controlled and the PMOS transistor MP2 with the diode connection.

While the negative voltage from the negative voltage generating circuit 32 and the voltage drop at the PMOS transistor MP2 are fixed, the current control at the PMOS transistor MP1 is variably controlled by the differential amplification signal VFB. The differential amplification signal VFB is an output signal of the differential amplifier 21 and a difference voltage of the divided voltage of the bit line bias voltage BLD with respect to the reference voltage Vref is inverted and amplified. That is, in the state of the bit line bias voltage BLD in which the divided voltage is higher than the reference voltage Vref, the voltage value of the differential amplification signal VFB lowers so that the ON resistance of the PMOS transistor MP1 is reduced.

The word line bias voltage supplied to the variable reference voltage terminal XDS is applied to the word lines WL0–WL2. Thus, if the voltage at the variable reference voltage terminal XDS lowers, the voltage at the word lines WL0–WL2 also lowers thereby reducing the number of the memory cells becoming conductive of the over-erase memory cells MC0–MC2. As a result, the sum of the drain current is reduced so that an operation allowance is secured with respect to the driving performance of the bit line voltage generating circuit 41 and consequently, the bit line bias voltage BLD is raised. If the voltage of the word lines WL0–WL2 is raised by a rise of the voltage of the variable reference voltage terminal XDS, the number of the memory cells becoming conductive of the over-erase memory cells MC0–MC2 is increased. The sum of the drain current is increased and the bit line bias voltage BLD lowers.

When the number of the memory cells MC0–MC2 conductive depending on bias condition from the word line voltage generating circuit 31 is changed, the sum of the drain current in the memory cell is changed so that the bit line bias voltage BLD outputted from the bit line voltage generating circuit 41 is also changed. A change of this bit line bias voltage BLD is always detected by the differential amplifier 21 and by adjusting the output voltage from the word line voltage generating circuit 31 according to a differential amplification signal VFB corresponding to a detection result, the number of memory cells becoming conductive is controlled. The bit line bias voltage BLD is maintained so as to make the best use of the driving performance of bit line voltage generating circuit 41 by a feedback control constituted of this feedback loop.

A word line bias voltage detecting section 62 comprises a PMOS transistor MP3 whose source terminal is connected to the power source voltage VCC and whose gate terminal is connected to ground voltage so as to constitute a current source and a NMOS transistor MN1 whose source terminal is connected to ground voltage and whose gate terminal is connected to the variable reference voltage terminal XDS. The drain terminals of both transistors are connected to each other so that the APDE-end signal END/ is outputted. The signal END/ which terminates the APDE operation by detecting that the word line bias voltage outputted from the word line voltage generating circuit 31 to the variable reference voltage terminal XDS has reached a predetermined voltage is outputted.

The threshold voltage of the over-erase memory cell after data erased is dispersed in a region from the maximum threshold voltage to the negative voltage under a condition in which data is erased. If the APDE operation is carried out by the feedback loop shown in FIG. 2, the threshold voltage of a memory cell having a threshold voltage of a negative voltage side is adjusted so that it is adjusted to a threshold voltage of the word line bias voltage. Because the word line bias voltage rises successively as it is adjusted, a point in which a predetermined voltage is reached can be set up as APDE operation end state.

FIG. 2 shows a structure in which the predetermined voltage is set to the same voltage as the threshold voltage of the NMOS transistor MN1. If when the predetermined voltage is inputted, the NMOS transistor MN1 is conductive and its On resistance becomes lower than the ON resistance of PMOS transistor MP3, the APDE-end signal END/ is inverted to low level. By setting the predetermined voltage to the threshold voltage, the lower limit value of distribution of the threshold voltage of the memory cell when data is erased can be a higher positive voltage than 0V so that the distribution of the threshold voltage of the memory cell when data is erased can be prevented from being expanded.

Figure 3:
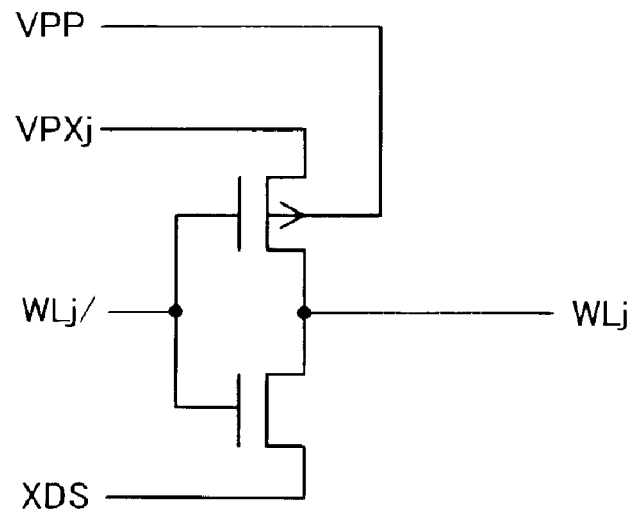
FIG. 3 is a circuit diagram showing a specific example of a word line driver.

FIG. 3 is a circuit diagram showing a specific example of word line drivers WD0–WD2. This word line driver contains an inverter gate structure comprised of the PMOS transistor and NMOS transistor. The boosted voltage VPP is connected to a back gate terminal of the PMOS transistor and the variable power source voltage terminal VPXj is connected to the source terminal. The variable reference voltage terminal XDS is connected to the source terminal of the NMOS transistor. The drain terminals of both the transistors are connected to each other and connected to a word line WLj. A word line selection signal WLj/ of negative logic is inputted to the gate terminal.

Upon normal read operation, the boosted voltage VPP is applied to the variable power source voltage terminal VPXj and the reference voltage is applied to the variable reference voltage terminal XDS. Then, the word line selection signal WLj/ to a selected word line changes to low level so that the boosted voltage VPP is applied to the word line WLj. As for a non-selected word line, if the word line selection signal WLj/ is maintained at a high level, the reference voltage is applied to the word line WLj.

Upon the APDE operation, if the power source voltage VCC is applied to the variable power source voltage terminal VPXj, the word line bias voltage is applied to the variable reference voltage terminal XDS and the word line selection signal WLj/ in a word line non-selection state is maintained at a high level, the word line bias voltage is applied to the word line WLj. Upon the APDE operation, if the NMOS transistor is conductive with the word line maintained in the non-selective state, the word line bias voltage WLj, which is applied to the variable reference voltage terminal XDS through the feedback loop, can be applied to the word line WLj as it is.

Figure 4:
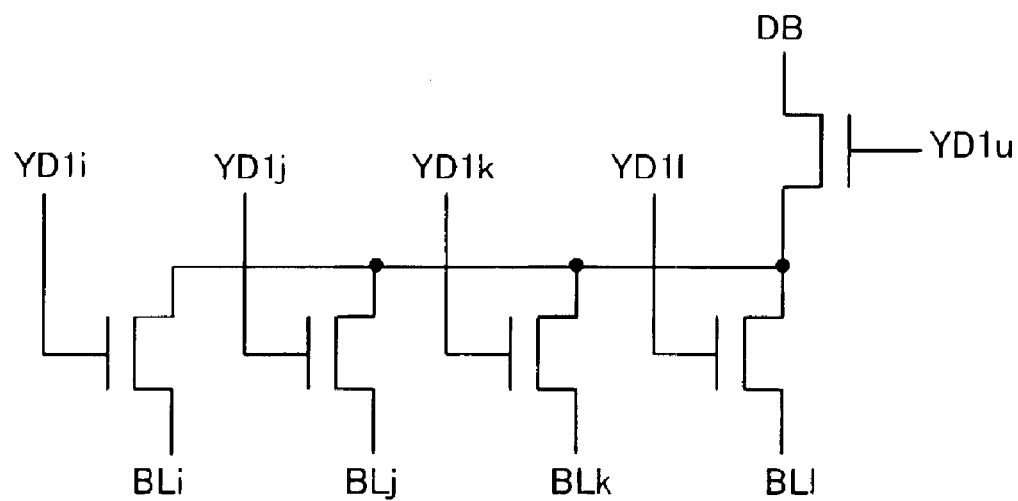
FIG. 4 is a circuit diagram showing a specific example of a Y path gate.

FIG. 4 is a circuit diagram showing a specific example of the Y path gate 51. The Y path gate 51 of FIG. 4 indicates an example of a circuit for a path gate common to the normal data access time and APDE operation time. A two-stage structured NMOS transistor switch is provided between the data line DB and each of respective bit line BLi–BLl. The NMOS transistor provided on the data line side is electrically controlled by a high-order-bit column address YD1u. The NMOS transistor provided on the bit line side is electrically controlled by a low-order-bit column address YD1i–YD1l.

Upon normal data access, a single bit line is selected from bit lines BLi to BLl selected by the high-order-bit column address YD1u by the low-order-bit column address YD1i to YD1l and connected to the data line DB so as to perform data access. Upon APDE operation, the low-order-bit column address YD1i to YD1l are selected at the same time by logical OR with the state signal ACT so that the bit lines BLi to BLl are connected to the data line DB. The bit line bias voltage BLD outputted from the bit line voltage generating circuit 41 is supplied to the bit lines BLi to BLl at the same time.

In FIG. 4, an example in which four column addresses YD1i to YD1l are selected at the same time as a result of logical OR between the low-order-bit address YD1i to YD1l and the state signal ACT has been described. The column address, which is subjected to logical OR with the state signal ACT, can be combined appropriately as well as the high-order-bit column address. The number of the bit lines, which are subjected to the APDE operation at the same time, can be set up appropriately.

Even if the data erase operation is carried out for selected plural bit lines 11, the APDE operation can be executed all together for the same selected bit lines 11. Further, after a sequence of the data erase operation is performed, it is permissible to select the bit lines 11 subjected to the data erase operation and execute the APDE operation for them together. The number of the bit lines 11 which are subjected to the APDE operation can be adjusted at the same time corresponding to the driving performance of the bit line voltage generating circuit 41.

Figure 5:
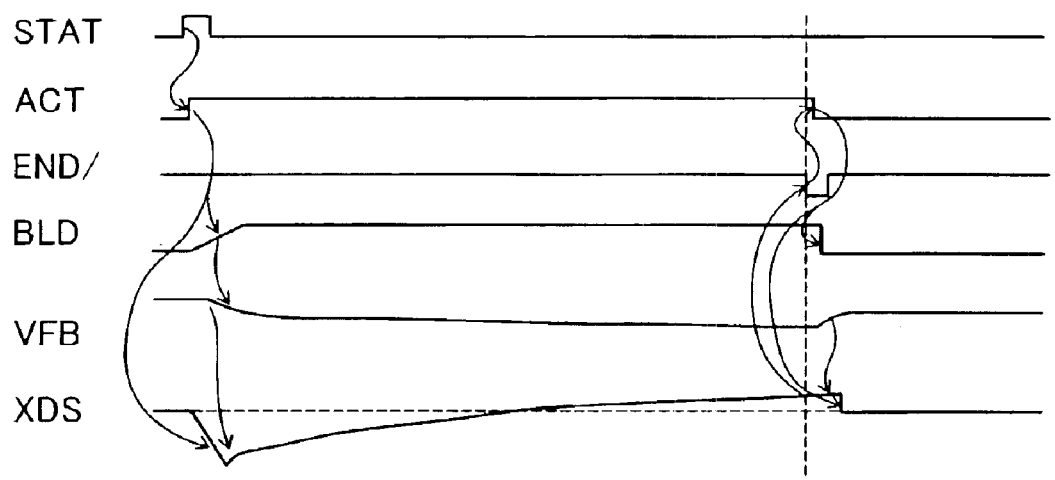
FIG. 5 shows operational waveform of the first embodiment.

FIG. 5 shows an operation from start of the APDE operation to an end thereof. If an APDE-start signal STAT is inputted as high-level pulse signal, the APDE state is latched by the state latch circuit 61 so that a high-level state signal ACT and low-level state signal ACT/ are outputted. After an enable terminal EN receives the state signal ACT, the bit line voltage generating circuit 41 and the negative voltage generating circuit 32 are started and then, the bit line bias voltage BLD is raised and at the same time, a negative voltage is applied to the variable reference voltage terminal XDS from the negative voltage generating circuit 32 through the word line voltage generating circuit 31. At this time, the NMOS transistor MN2 is made non-conductive by the state signal ACT/ and at the same time, the PMOS transistor MP4 is made conductive so that the bit line bias voltage BLD is applied to the drain terminals of the memory cells MC0–MC2. When the bit line bias voltage BLD is being raised just after its startup, the voltage of an inversion input terminal of the differential amplifier 21 is lower than the reference voltage Vref and high-level is outputted as the differential amplification signal VFB. Thus, the voltage adjusting section 33 of the word line voltage generating circuit 31 is not started up. Thus, a negative voltage outputted from the negative voltage generating circuit 32 is outputted to the variable reference voltage terminal XDS just as it is. This is a state not controlled by the feedback loop.

After the startup, the bit line bias voltage BLD rises and when the input voltage to the inversion input terminal of the differential amplifier 21 reaches substantially the same level as the reference voltage Vref, control by the feedback loop is started. Because such control is applied continuously by the feedback loop, if the bit line bias voltage BLD is high, the voltage level of the differential amplification signal VFB lowers, the voltage level at the variable reference voltage terminal XDS is raised so that a control to lower the bit line bias voltage BLD is applied. If the bit line bias voltage BLD is low, a control for raising the bit line bias voltage BLD is applied so that as shown in FIG. 5, the bit line bias voltage BLD is maintained at a predetermined voltage.

In this while, the threshold voltage of an over-erase memory cell continues to be adjusted so that memory cells having a negative threshold voltage decrease and therefore, the voltage level of the variable reference voltage terminal XDS is raised gradually. If this voltage level reaches the threshold voltage level of the NMOS transistor MN1, it is detected by a word line bias voltage detecting section 62. An APDE-end signal END/ is outputted from the word line bias voltage detecting section 62 as a low-level pulse signal so that the APDE state of the state latch circuit 61 is reset. Consequently, the state signals ACT and ACT/ are reset, the bit line voltage generating circuit 41 and the negative voltage generating circuit 32 are made inactive and the PMOS transistor MP4 is made non-conductive. Additionally, the NMOS transistor MN2 is made conductive and the output terminal of the bit line voltage generating circuit 41 is fixed to ground voltage.

According to the first embodiment, if it is intended to adjust the threshold voltage of over-erase memory cells MC0–MC2 distributed in a depletion region in which the threshold voltage is less than 0V after data erase, the word line bias voltage, which is a gate voltage applied to the gate terminal, is so controlled depending on the driving capacity of the bit line voltage generating circuit 41 which is an example of a drain voltage generating section. The bit line bias voltage BLD, which is a drain voltage, is maintained at a predetermined drain voltage before it reaches an overload state. Thus, irrespective of the driving capacity of the bit line voltage generating circuit 41, the threshold voltage can be adjusted under a bias condition which always enables that driving condition to be exerted to its maximum extent.

When the threshold voltage is adjusted after the data erase, for the over-erase memory cells MC0–MC2 whose threshold voltages are distributed in the region of a negative voltage of less than 0V, which is a depletion region, only a memory cell having a threshold voltage less than a negative voltage applied to the gate terminal as an initial voltage can be conductive so that the adjustment operation for the threshold voltage can be started depending on the driving capacity of the bit line voltage generating circuit 41.

The memory cells MC0–MC2 distributed in the region of the threshold voltage of less than 0V are adjusted successively starting from the negative threshold voltage side and finally brought to near the threshold voltage of the word line bias voltage. Because the word line bias voltage rises continuously as the memory cells on the negative threshold voltage side are adjusted, the threshold voltage of the memory cells also rises successively so that finally they are adjusted to near the threshold voltage of the NMOS transistor MN1, which is a predetermined gate voltage. A lower limit of the effective threshold voltage distribution of the memory cells MC0–MC2 can be set up depending on a predetermined voltage, so that the distribution of the threshold voltage after the adjustment can be set up. The characteristic distribution of the threshold voltage of the memory cell by the data erase operation can be set up.

Because the word line bias voltage serves as the lower limit of the effective threshold voltage distribution, if it is set up that the adjustment of the threshold voltage is completed when it is detected that the word line bias voltage is a threshold voltage of the NMOS transistor MN1, the threshold voltage does not have to be verified after the adjustment operation. As a result, the adjustment period for the threshold voltage after the data erase can be reduced.

The lower limit of the distribution of the adjusted threshold voltage can be set up and the characteristic distribution of the threshold voltages of the memory cells MC0–MC2 by the data erase operation can be set up.

Because the word line bias voltage is controlled continuously depending on a difference in voltage between the bit line bias voltage BLD and the reference voltage Vref which is an example of predetermined drain voltage, irrespective of the driving performance of the bit line voltage generating circuit 41, the adjustment operation of the threshold voltage can be always carried out under a bias condition which enables the driving performance to be exerted to the maximum extent in the adjustment period of the threshold voltage. Consequently, an effective adjustment operation can be executed so that the adjustment period of the threshold voltage for the over-erase memory cells MC0–MC2 after the data erase can be reduced.

Figure 6:
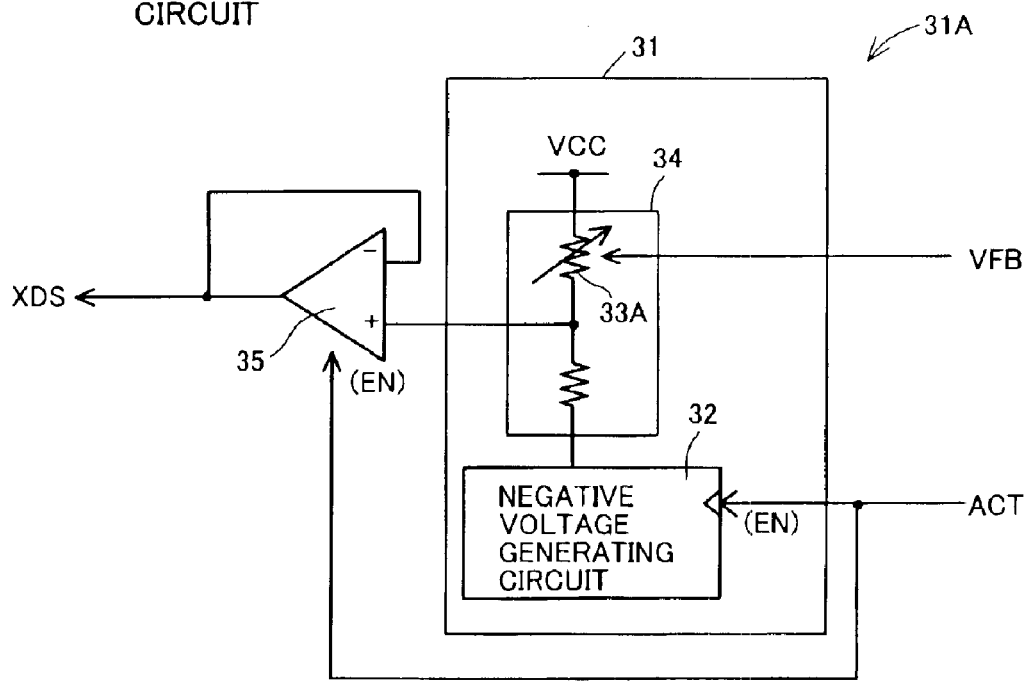
FIG. 6 is a circuit diagram showing a first variant of a word line voltage generating circuit.

FIG. 6 shows a first modification 31A of the word line voltage generating circuit. A resistance divider circuit 34 containing a variable resistance circuit 33A is disposed as a voltage adjusting section between the output terminal of the negative voltage generating circuit 32 and the power source voltage VCC. A divided voltage outputted from the resistance divider circuit 34 is supplied to the variable reference voltage terminal XDS through a buffer circuit 35. The variable resistance circuit 33A equipped on the resistance divider circuit 34 is controlled by a differential amplification signal VFB. Plural resistor devices can be achieved by not only a structure using the ON resistance of the MOS transistor as indicated in the voltage adjusting section 33 (FIG. 2), but also a structure of exchanging the plural resistor devices with the MOS transistor switch. While the word line voltage generating circuit 31 (FIG. 2) adjusts a voltage for a negative voltage output terminal of the negative voltage generating circuit 32 having a driving performance to the reference voltage terminal of the buffer circuit 35 which has little load, the voltage can be adjusted thereby achieving the word line voltage generating circuit 31A in which current consumption is reduced.

Figure 7:
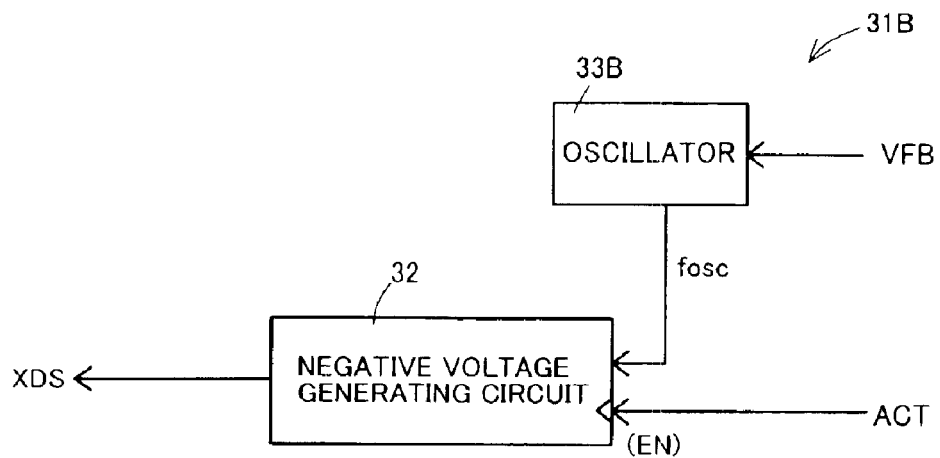
FIG. 7 is a circuit diagram showing a second variant of a word line voltage generating circuit.

FIG. 7 shows a second modification 31B of the word line voltage generating circuit. This embodiment includes an oscillator 33B whose oscillation frequency is controlled by a differential amplification signal VFB as a voltage adjusting section. If the negative voltage generating circuit 32 is constituted in a charge pump circuit system, the voltage level of negative voltage supplied to the variable reference voltage terminal XDS can be adjusted by changing a frequency signal fOSC for pumping supplied to the negative voltage generating circuit 32. A current path for dividing the voltage value with resistance does not have to be equipped, thereby the word line voltage generating circuit 31B whose current consumption is reduced is realized.

Figure 8:
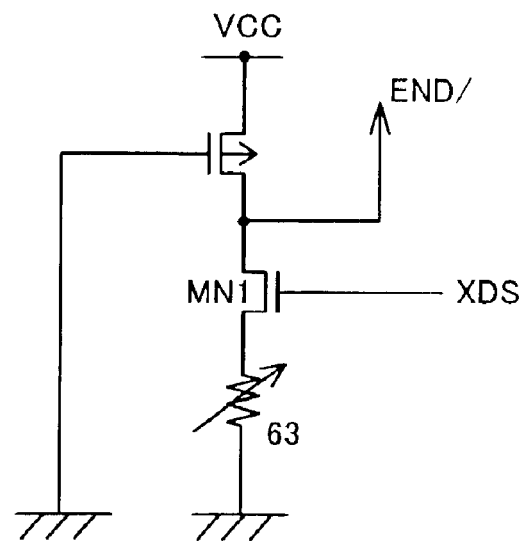
FIG. 8 is a circuit diagram showing a first variant of a word line bias voltage detecting section.

FIG. 8 shows a first modification of the word line bias voltage detecting section. A variable resistance circuit 63 is provided between the source terminal of the MOS transistor MN1 and the ground voltage as well as the word line bias voltage detecting section 62 (FIG. 2). Like the variable resistance circuit 33A shown in FIG. 6, the variable resistance circuit 63 can be achieved by not only the structure using ON resistance of the MOS transistor adjusted by an analog voltage value but also a structure in which plural resistor devices are exchanged by the MOS transistor switches. This can be applied to a case where the predetermined voltage of the variable reference voltage terminal XDS for outputting the APDE-end signal END/ is adjusted to a higher voltage value than the NMOS transistor MN1.

Figure 9:
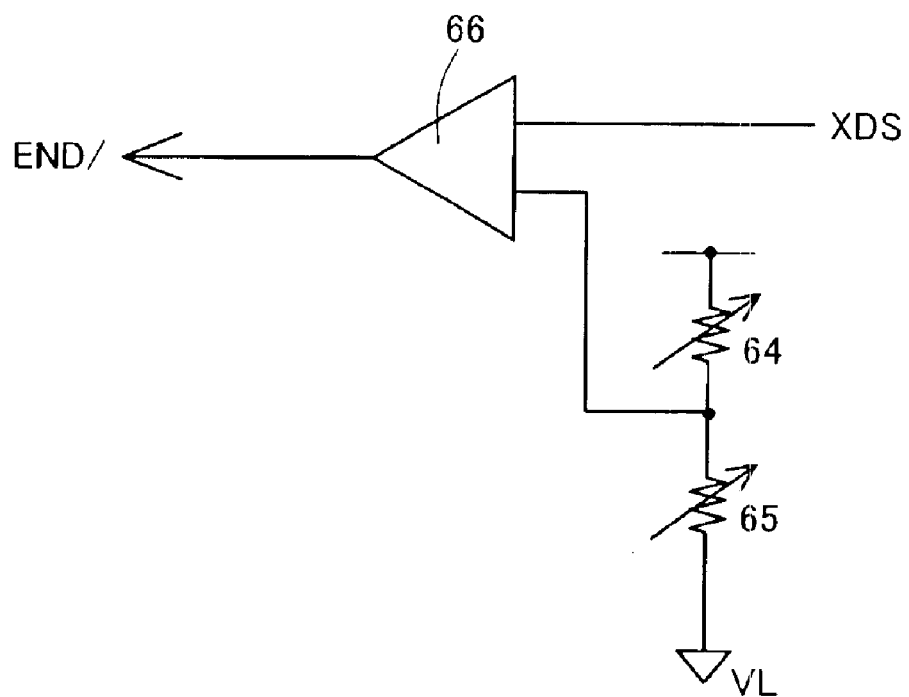
FIG. 9 is a circuit diagram showing a second variant of a word line bias voltage detecting section.

FIG. 9 shows a second modification of the word line bias voltage detecting section. This embodiment includes a comparator 66 for comparing the voltage level of the variable reference voltage terminal XDS with a predetermined voltage. The predetermined voltage is produced as a result of dividing a voltage with resistance circuits 64, 65, at least any one of which has resistance varying mechanism. This resistance varying mechanism can be constructed in the same circuit structure as the variable resistance circuit 63 (FIG. 8). A low level voltage VL connected to the resistance circuit 65 can be ground voltage or negative voltage. The predetermined voltage can be set to any voltage value.

Figure 10:
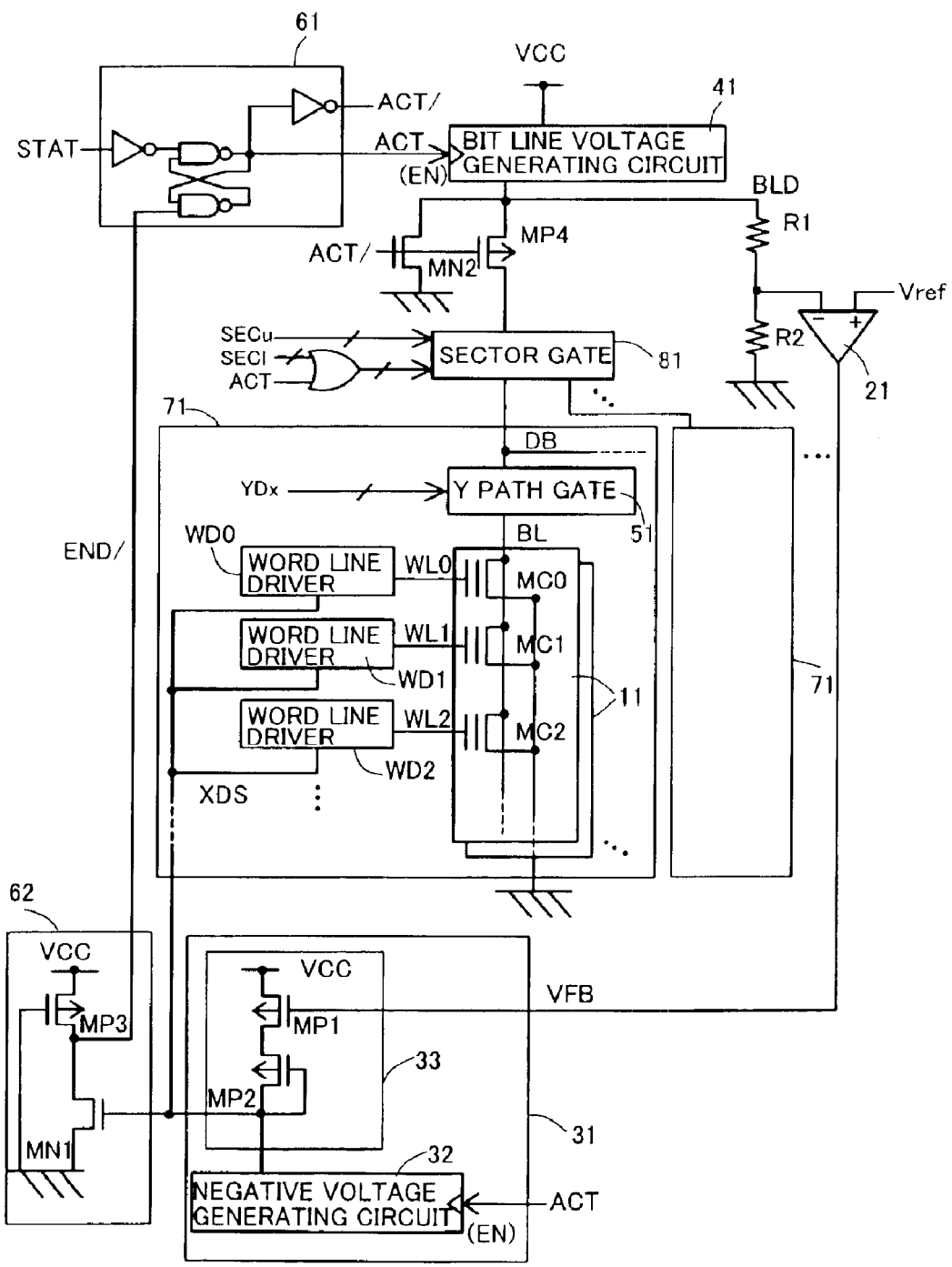
FIG. 10 is a circuit diagram of a second embodiment.
Figure 11:
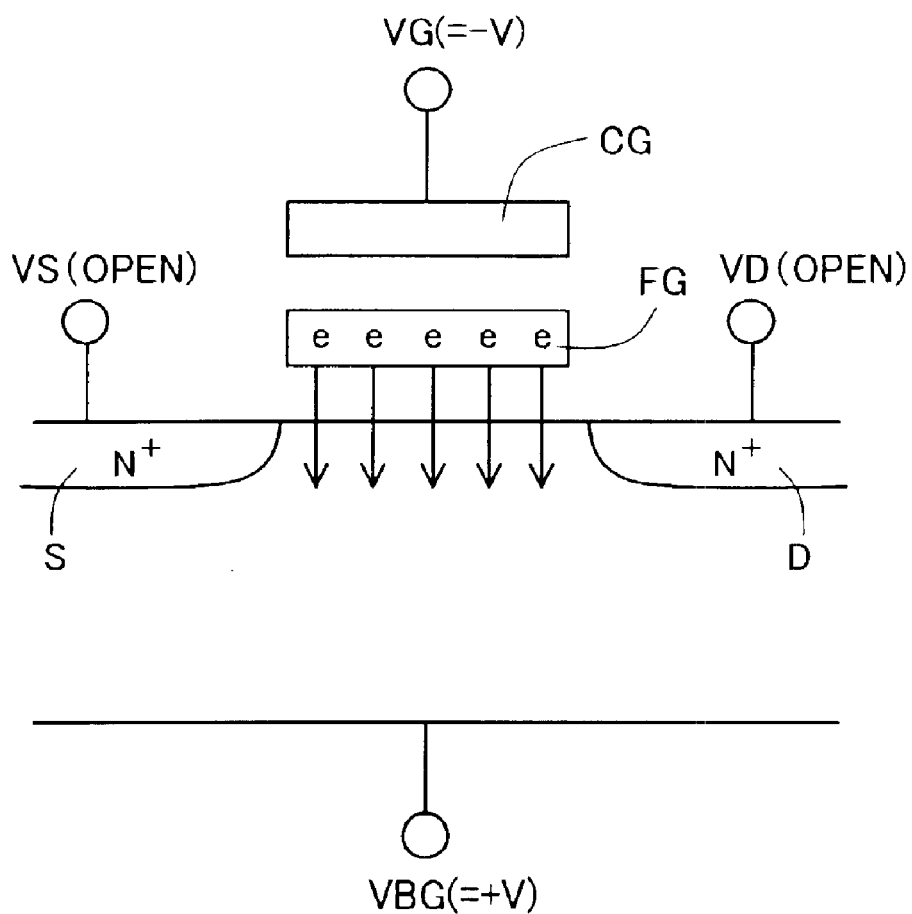
FIG. 11 is a sectional view of a memory cell biased to erase operation state.
Figure 12A:
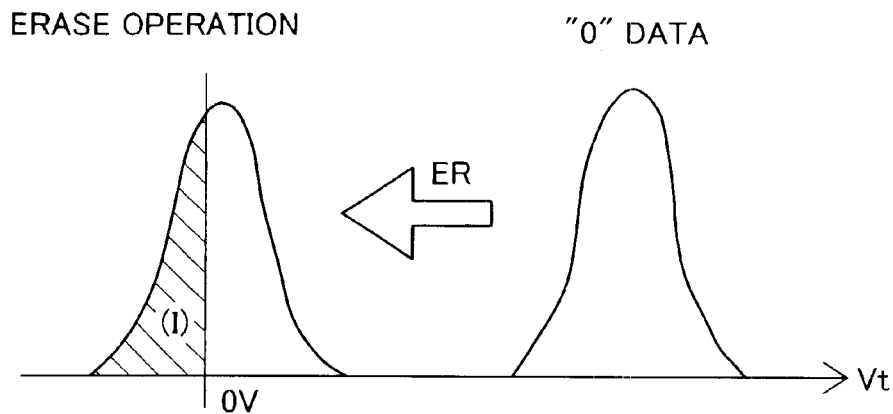
FIG. 12(A) shows threshold voltage distribution of memory cell in erase operation.
Figure 12B:
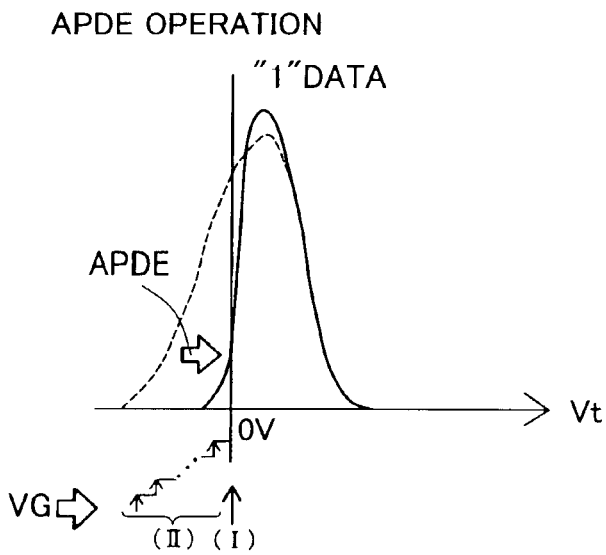
FIG. 12(B) shows threshold voltage distribution of memory cell in APDE operation.
Figure 13:
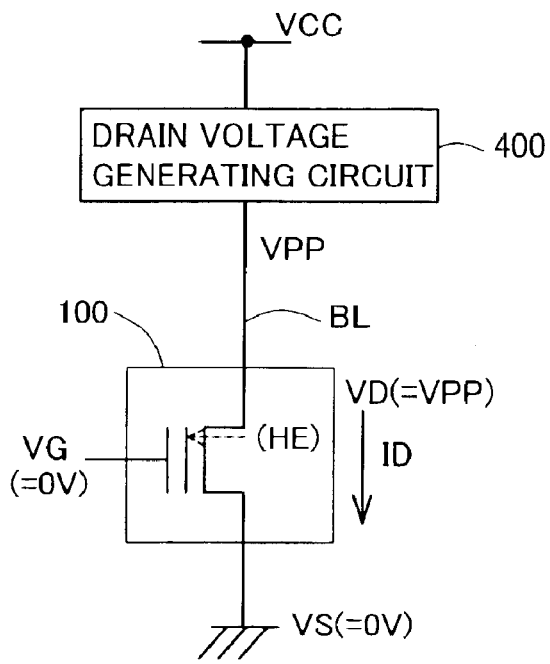
FIG. 13 is a circuit block diagram showing bias relation in conventional APDE operation.
Figure 14:
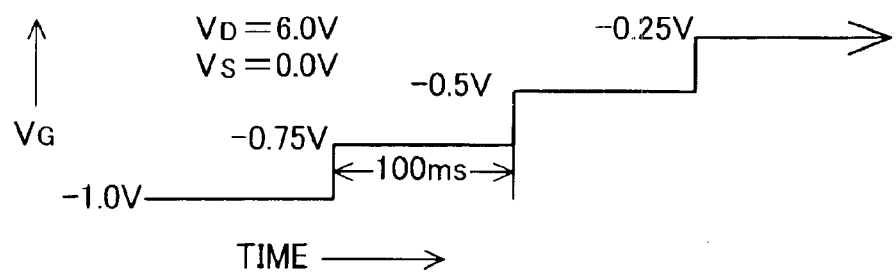
FIG. 14 shows waveform of gate voltage in other conventional APDE operation.

FIG. 10 shows a circuit diagram of a second embodiment of the present invention. The second embodiment indicates a bias application structure at the time of the APDE operation in case where plural sectors 71 are equipped. The bit line bias voltage BLD from the bit line voltage generating circuit 41 is supplied to the sector 71 selected by a sector gate 81. Selection of the sector 71 by the sector gate 81 is the same as the case for the Y path gate 51 of the first embodiment. That is, this selection is carried out by a high-order-bit sector address SECu and a low-order-bit sector address SEC1, which is subjected to logical OR for each bit with the state signal ACT. Upon normal data access, a sector 71 of plural sectors is selected. Upon the APDE operation, at least one of the plural sectors 71 is selected. In the meantime, the word line bias voltage can be supplied to each sector 71.

The circuit configuration, operation and effect except the selection of the sector 71 by the sector gate 81 are the same as the first embodiment and a description thereof is omitted.

According to the second embodiment, even if the data erase operation is carried out for the selected plural sectors 71, the APDE operation can be executed in batch for the same selected sectors 71. Further, after a sequence of the data erase operation is performed, it is permissible to execute the APDE operation in batch for the selected sectors 71, which are subjected to the data erase operation. The number of the sectors 71 for which the APDE operation is scheduled can be adjusted corresponding to the driving performance of the bit line voltage generating circuit 41.

Needless to say, the present invention is not restricted to the above-described embodiments, but may be improved or modified in various ways within a scope not departing from the gist of the present invention.

For example, although this embodiment is set up for a case where a bit line 11 scheduled for the APDE operation through the Y path gate 51 is selected, it is permissible to select a word line driver for supplying a word line bias voltage applied to the variable reference voltage terminal XDS to the word line in addition to or instead of the same example.

Although a case where a semiconductor memory unit contains a unit of the word line voltage generating circuit 31 or the bit line voltage generating circuit 41 has been described, the present invention is not restricted to this example, but it is permissible to provide each predetermined region therewith.

Although the differential amplifier 21 indicated here is always in an activated condition, it is permissible to so construct it that its circuit operation is stopped by the state signal ACT or ACT/ after the APDE operation.

Although an example in which activation/non-activation of each circuit is performed by the state signal ACT or ACT/ has been described here, if each circuit is provided with a state latch function, the state latch circuit 61 is not necessary and it can be so constructed that the APDE-start signal STAT and APDE end signal END/ are inputted directly into each circuit.

The present invention provides a threshold voltage adjustment method of a nonvolatile semiconductor memory device which enables memory data to be electrically rewritten, wherein even if there exist a large number of memory cells over-erase by the erase operation, the gate voltage of the memory cell is controlled continuously so as to maintain the maximum number of the over-erase memory cells which are conductive in order to adjust the threshold voltage after the erase, thereby adjustment of the threshold voltage being achieved in a short time and a nonvolatile semiconductor memory device of the same.

What is claimed is:

1. A threshold voltage adjustment method of a nonvolatile semiconductor memory device that has memory cells and conducts data erase of the memory cells by changing threshold voltage with electrical bias, the threshold voltage adjustment method adjusting the threshold voltage to the memory cells after the data erase and comprising steps of:

drain voltage applying step for applying drain voltage to drain terminals of the memory cells;

comparing step for comparing the drain voltage to be applied to the drain terminals with predetermined drain voltage; and gate voltage applying step for controlling the drain voltage applying step by applying variable gate voltage to gate terminals of the memory cells in accordance with a comparison result obtained in the comparing step.

2. A threshold voltage adjustment method of a nonvolatile semiconductor memory device according to claim 1, wherein the variable gate voltage continuously varies in the gate voltage applying step so as to keep the drain voltage to the predetermined drain voltage in the drain voltage applying step.

3. A threshold voltage adjustment method of a nonvolatile semiconductor memory device according to claim 2, wherein, in the gate voltage applying step, the variable gate voltage is controlled depending on difference voltage of the drain voltage obtained with reference to the predetermined drain voltage at the comparing step.

4. A threshold voltage adjustment method of a nonvolatile semiconductor memory device according to claim 3, wherein the variable gate voltage is raised in response to the difference voltage in positive and is lowered in response to the difference voltage in negative.

5. A threshold voltage adjustment method of a nonvolatile semiconductor memory device according to claim 1, wherein the variable gate voltage is continuously raised from initial voltage toward final voltage.

6. A threshold voltage adjustment method of a nonvolatile semiconductor memory device according to claim 1, wherein initial voltage of the variable gate voltage is negative voltage with reference to applied voltage to source terminals of the memory cells.

7. A threshold voltage adjustment method of a nonvolatile semiconductor memory device according to claim 1, wherein final voltage of the variable gate voltage is equivalent to predetermined gate voltage that is same as or lower than maximum threshold voltage among the memory cells in condition of the data erase.

8. A threshold voltage adjustment method of a non-volatile semiconductor memory device according to claim 1 further comprising adjustment-operation-stop instructing step for instructing to stop adjustment of the threshold voltage by constantly monitoring the variable gate voltage and detecting that the variable gate voltage reaches predetermined gate voltage.

9. A threshold voltage adjustment method of a non-volatile semiconductor memory device according to claim 8 further comprising detection voltage adjusting step for varying the predetermined gate voltage.

10. A threshold voltage adjustment method of a non-volatile semiconductor memory device according to claim 1, wherein the predetermined drain voltage is boosted voltage.

11. A threshold voltage adjustment method of a non-volatile semiconductor memory device according to claim 1, wherein batch adjustment of the threshold voltage is conducted to an erased region where the data erase in memory cell array is conducted.

12. A threshold voltage adjustment method of a non-volatile semiconductor memory device according to claim 1, batch adjustment of the threshold voltage is conducted to predetermined number of bit lines out of a plurality of bit lines included in an erase region to which the data erase in memory cell array is conducted.

13. A non-volatile semiconductor memory device conducting data erase of memory cells by changing threshold voltage with electrical bias, for adjusting the threshold voltage of the memory cells after the data erase, the non-volatile semiconductor memory device comprising:

a drain voltage generating section for supplying drain voltage to drain terminals of the memory cells, the drain voltage generating section being activated based on a threshold voltage adjusting signal;

a drain voltage detecting section for detecting the drain voltage; and a gate voltage generating section for controlling variable gate voltage to be applied to gate terminals of the memory cells based on a drain voltage detecting signal from the drain voltage detecting section, the gate voltage generating section being activated based on the threshold voltage detecting signal.

14. A non-volatile semiconductor memory device according to claim 13, wherein the variable gate voltage is continuously varied in the gate voltage generating section so as to keep the drain voltage to predetermined drain voltage.

15. A non-volatile semiconductor memory device according to claim 13, wherein the drain voltage detecting section includes a differential amplifier that outputs the drain voltage detecting signal in accordance with a reference input signal inputted based on the predetermined drain voltage and an input signal inputted based on the drain voltage.

16. A non-volatile semiconductor memory device according to claim 13, wherein the gate voltage generating section includes a voltage adjusting section controlled by the drain voltage detecting signal, and the voltage adjusting section conducts: positive voltage adjustment to the drain voltage detecting signal that indicates the drain voltage is higher than the predetermined drain voltage; and negative voltage adjustment to the drain voltage detecting signal that indicates the drain voltage is lower than the predetermined drain voltage.

17. A non-volatile semiconductor memory device according to claim 13 further comprising a gate voltage detecting section for detecting the variable gate voltage as predetermined gate voltage, wherein at least either one of the drain voltage generating section or the gate voltage generating section is deactivated based on a gate voltage detecting signal from the gate voltage detecting section.

18. A non-volatile semiconductor memory device according to claim 17, wherein the gate voltage detecting section includes a predetermined gate voltage setting section for setting the predetermined gate voltage.

19. A non-volatile semiconductor memory device according to claim 13, wherein in case the data erase is conducted by selecting at least one sector plotted for each predetermined region of memory cell array as erase sector, the non-volatile semiconductor memory device further includes a sector gate section for connecting at least either one of the drain voltage generating section or the gate voltage generating section to the erase sector, and batch adjustment of the threshold voltage is conducted to the erase sector.

20. A non-volatile semiconductor memory device according to claim 13 further comprising a path gate section for connection at least either one of the drain voltage generating section or the gate voltage generating section to predetermined number of bit lines out of a plurality of bit lines included in an erase sector to which the data erase is conducted, and batch adjustment of the threshold voltage to the predetermined number of bit lines is conducted.

* * * * *